(12) United States Patent
Nihei et al.

(10) Patent No.: US 9,070,836 B2
(45) Date of Patent: Jun. 30, 2015

(54) SEMICONDUCTOR LIGHT-EMITTING DEVICE

(71) Applicant: STANLEY ELECTRIC CO., LTD., Tokyo (JP)

(72) Inventors: Noriko Nihei, Sagamihara (JP); Takako Chinone, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 87 days.

(21) Appl. No.: 13/712,194

(22) Filed: Dec. 12, 2012

(65) Prior Publication Data
US 2013/0153951 A1   Jun. 20, 2013

(30) Foreign Application Priority Data
Dec. 16, 2011 (JP) ................................. 2011-275908

(51) Int. Cl.
*H01L 31/062* (2012.01)
*H01L 31/113* (2006.01)
(Continued)

(52) U.S. Cl.
CPC .............. *H01L 33/42* (2013.01); *H01L 33/005* (2013.01); *H01L 33/38* (2013.01); *H01L 2933/0016* (2013.01)

(58) Field of Classification Search
CPC .................. H01L 33/42; H01L 33/005; H01L 2933/0016; H01L 33/38; H01L 2924/00; H01L 2224/48091; H01L 2924/00014; H01L 2924/0002; H01L 33/20; H01L 33/0079; H01L 33/405; H01L 33/44

USPC ....................... 257/79, 99, 228, 290
See application file for complete search history.

(56) References Cited

U.S. PATENT DOCUMENTS 6,163,036 A    12/2000  Taninaka et al.
7,646,036 B2    1/2010  Kozawa et al.
(Continued)

FOREIGN PATENT DOCUMENTS

JP   04239185 A    8/1992
JP   2001-156331 A   6/2001
(Continued)

OTHER PUBLICATIONS

U.S. Appl. No. 13/588,305; M. Miyachi et al; filed Aug. 17, 2012; LED Array Capable of Reducing Uneven Brightness Distribution.
(Continued)

*Primary Examiner* — Michelle Mandala
(74) *Attorney, Agent, or Firm* — Holtz, Holtz, Goodman & Chick PC (57) ABSTRACT

A semiconductor light-emitting device includes a lamination of semiconductor layers including a first layer of a first conductivity type, an active layer, and a second layer of a second conductivity type; a transparent conductive film formed on a principal surface of the lamination and having an opening; a pad electrode formed on part the opening; and a wiring electrode connected with the pad electrode, formed on another part of the opening while partially overlapping the transparent conductive film; wherein contact resistance between the transparent conductive film and the lamination is larger than contact resistance between the wiring electrode and the lamination. Field concentration at the wiring electrode upon application of high voltage is mitigated by the overlapping transparent conductive film.

12 Claims, 7 Drawing Sheets

(51) Int. Cl.
  *H01L 33/42* (2010.01)
  *H01L 33/00* (2010.01)
  *H01L 33/38* (2010.01)

(56) References Cited

U.S. PATENT DOCUMENTS

| | | | |
|---|---|---|---|
| 7,968,903 B2 * | 6/2011 | Unno | 257/99 |
| 8,053,805 B2 * | 11/2011 | Lim et al. | 257/99 |
| 2001/0032985 A1 | 10/2001 | Bhat et al. | |
| 2007/0278508 A1 | 12/2007 | Baur et al. | |
| 2011/0316009 A1 | 12/2011 | Fukasawa | |

FOREIGN PATENT DOCUMENTS

| | | |
|---|---|---|
| JP | 2007-519246 A | 7/2007 |
| JP | 2008-192782 A | 8/2008 |
| JP | 2011040425 A | 2/2011 |
| WO | WO 2005/071763 A2 | 8/2005 |

OTHER PUBLICATIONS

U.S. Appl. No. 13/598,951; M. Miyachi et al; filed Aug. 30, 2012; LED Array Capable of Reducing Uneven Brightness Distribution.
U.S. Appl. No. 13/693,238; T. Chinone; filed Dec. 4, 2012; Semiconductor Light Emitting Device.
Extended European Search Report dated Feb. 5, 2014, issued in European Application No. 12006023.1.
Non-Final Office Action dated Mar. 18, 2014, issued in related U.S. Appl. No. 13/598,951.
Non-final Office Action dated Mar. 30, 2015, issued in related U.S. Appl. No. 13/588,305.

* cited by examiner

FIG. 17
COMPARISON EXAMPLE

SEMICONDUCTOR LIGHT-EMITTING DEVICE

CROSS REFERENCE TO RELATED APPLICATION

This application is based on and claims priority of Japanese Patent Application 2011-275908, filed on Dec. 16, 2011, the entire contents of which are incorporated herein by reference.

BACKGROUND OF THE INVENTION

A) Field of the Invention

The present invention relates to a semiconductor light-emitting device and a method for manufacturing the same.

B) Description of the Related Art

A nitride semiconductor light-emitting diode (LED) using GaN or GaN-containing material can emit ultraviolet or blue light and is able to emit white light by using phosphor. An LED capable of outputting high power white light can be used also for illumination.

Though sapphire is generally used as a growth substrate for nitride semiconductor, sapphire is poor in heat dissipation due to its low thermal conductivity. As a structure for improving heat dissipation, the flip-chip structure where a semiconductor layer is bonded on a heat dissipative support substrate, with the sapphire substrate being disposed opposite side, is known.

In emitting light from the flip-chip structure, there occurs light reflection at the rear surface of the sapphire substrate, which lowers the efficiency of light emission. It has been proposed to remove the sapphire substrate by laser lift-off or abrasion after semiconductor lamination grown on the sapphire substrate is bonded on a support substrate. Also, there is proposed to form electrode structure having a shape serving both as wiring for current spreading and as n-side electrode for the diode, on the element upper surface (see, for example, WO 2005/071763, family US 2007/0278508, JP P2007-519246).

It is not easy to obtain uniform current distribution in a nitride semiconductor light-emitting device having a large chip area. Non-uniform current distribution increases the forward voltage drop and lowers the quantum efficiency. It is known to form, for example, a semi-transparent metallization layer over the entire surface of a chip for improving current spreading. However, it is necessary to have some thickness, for example 100 nm or more, for the semi-transparent metallization to achieve current spreading effect. Then, the semi-transparent metallization will absorb part of output light, to decrease the output power.

SUMMARY OF THE INVENTION

An object of the present invention is to prevent electric field concentrating on part of a wiring electrode when a high static voltage is accidentally applied to a semiconductor light-emitting device.

An aspect of the present invention provides a semiconductor light-emitting device including: a lamination of semiconductor layers including a first semiconductor layer of a first conductivity type, an active layer formed on the first semiconductor layer, and a second semiconductor layer of a second conductivity type formed on the active layer; a transparent conductive film formed on one of the principal surfaces of the lamination of semiconductor layers and having an opening; a pad electrode formed on part of the one principal surface exposed in the opening of the transparent conductive film; and a wiring electrode formed on another part of the one principal surface exposed in the opening of the transparent conductive film, connected with the pad electrode, and overlapping with part of the transparent conductive film; wherein contact resistance between the transparent conductive film and the lamination of semiconductor layers is larger than contact resistance between the wiring electrode and the lamination of semiconductor layers.

Another aspect of the present invention provides a method of manufacturing a semiconductor light-emitting device including: (a) preparing a growth substrate; (b) growing a lamination of semiconductor layers including a first semiconductor layer of a first conductivity type, an active layer on the first semiconductor layer, and a second semiconductor layer of a second conductivity type on the active layer; (c) separating the growth substrate from the lamination of semiconductor layers; (d) forming a transparent conductive film with an opening on a surface of the lamination of semiconductor layers exposed by separating the growth substrate in step (c); and (e) forming a pad electrode on part of the surface of the lamination of semiconductor layers exposed in the opening of the transparent conductive film and forming a wiring electrode on another part of the surface of the lamination of semiconductor layers exposed in the opening of the transparent conductive film, while being connected with the pad electrode and overlapping with part of the transparent conductive film; wherein step (d) forms the transparent conductive film in such a manner that contact resistance between the transparent conductive film and the lamination of semiconductor layers is larger than contact resistance between the wiring electrode and the lamination of semiconductor layers.

DESCRIPTION OF THE PREFERRED EMBODIMENTS

Prior to the description of the embodiment, a comparative example will be described.

Figure 17:
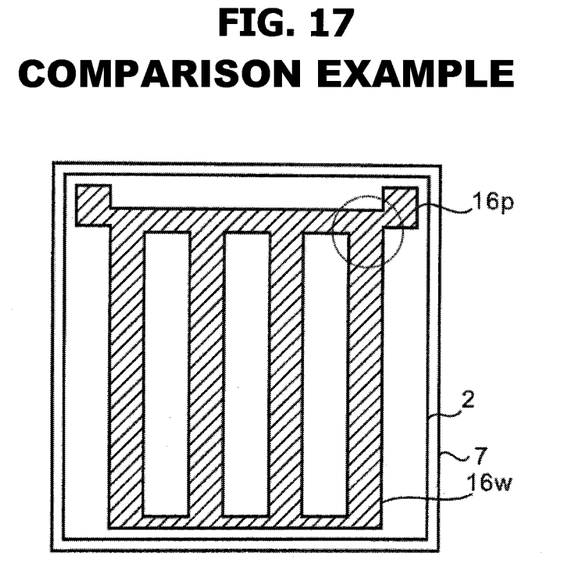
FIG. 17 is a schematic plan view of the nitride semiconductor light-emitting element according to a comparative example.

FIG. 17 is a plan view illustrating a pattern of a wiring electrode (16) of a semiconductor light-emitting device according to a comparative example.

In a semiconductor light-emitting element according to a comparative example illustrated in FIG. 17, a fine wire electrode (a wiring electrode) (16w) and a pad electrode (16p) are formed in contact with the surface of an n-type semiconductor layer of a lamination of semiconductor layers (2) that includes at least an n-type semiconductor layer, an active layer for light emission, and a p-type semiconductor layer.

A crack or cracks may be generated around the pad electrode (16p) when a high static voltage is applied. In the comparative example, though a pattern of fine wires (16) is formed on a wide range of the semiconductor lamination 2 to prevent currents and voltages from concentrating on the pad electrode (16p), there may take place a phenomenon that when an excessive voltage is applied to the periphery of the pad electrode (16p) (inside the dotted region) where electric field concentration is most likely to occur, the semiconductor layer (2) is cracked and blown away due to its shock. Such damage to the semiconductor layer (2) may cause a short-circuit or leak of the semiconductor light-emitting device and failure to light up. It is desirable to take some counter-measure to suppress damage even if an excessive voltage is applied to a semiconductor light-emitting device.

Figure 1A:
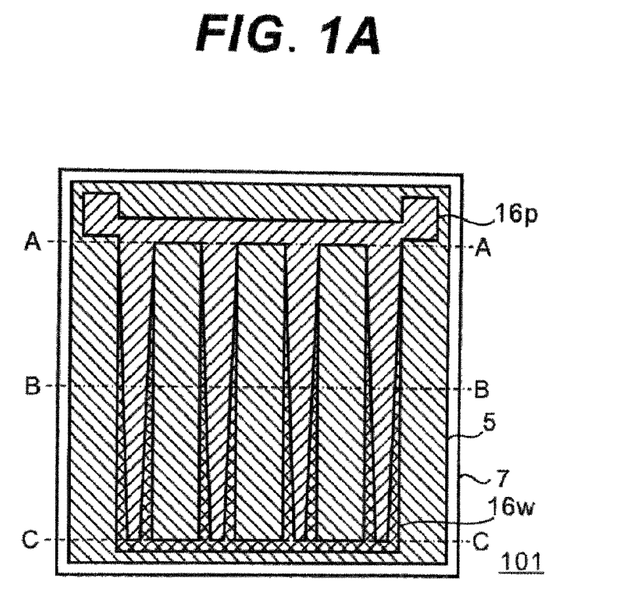
FIGS. 1A and 1B are schematic plan views illustrating an nitride semiconductor light-emitting element (LED element) (101) according to an embodiment of the invention.
Figure 1B:
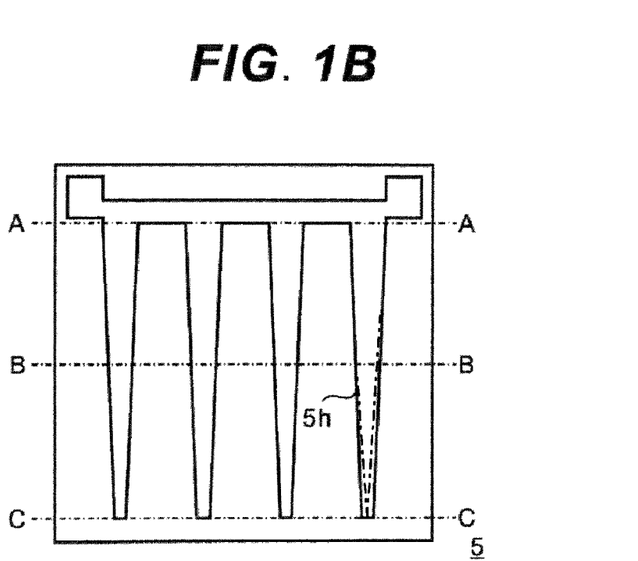
Figure 2A:
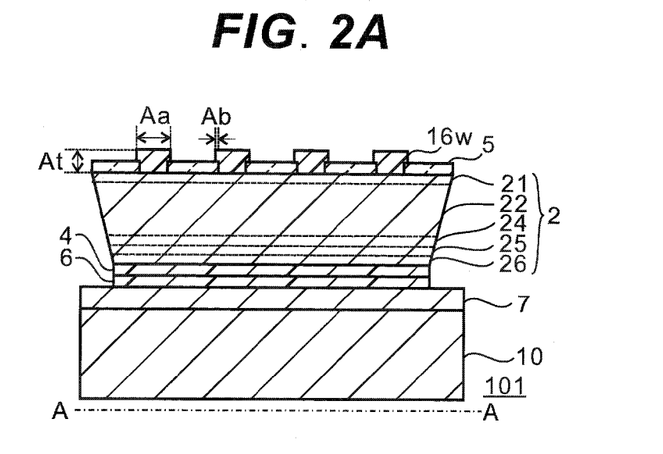
FIGS. 2A to 2C are schematic sectional views of the nitride semiconductor light-emitting element (LED element) along lines A-A, B-B, and C-C depicted in FIGS. 1A and 1B.
Figure 2B:
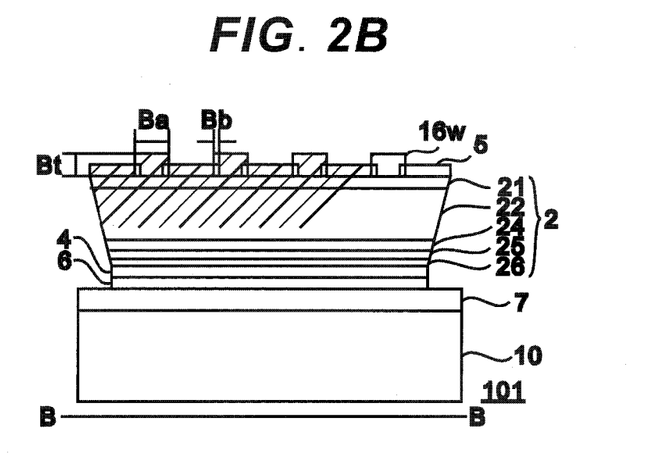
Figure 2C:
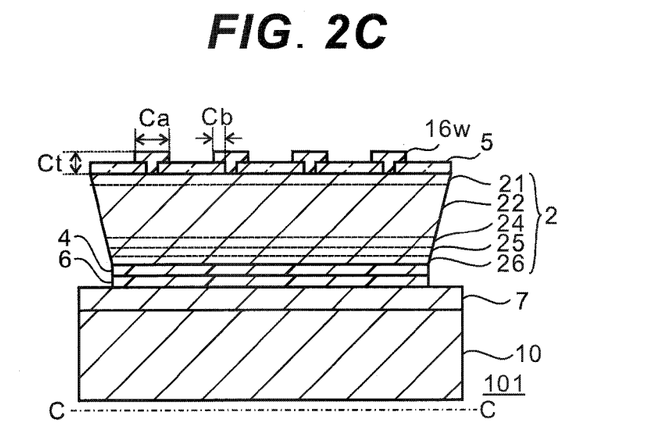

FIG. 1A is a schematic plan view illustrating a nitride semiconductor light-emitting element (LED element) (101) according to the embodiment, and FIG. 1B is a schematic plan view illustrating a pattern of a high-resistance transparent conductive film (5). FIGS. 2A to 2C are schematic sectional views illustrating the element structures of the LED element (101) along lines AA, BB, and CC in FIGS. 1A and 1B, respectively. In the following explanation, a light-emitting device (LED) having a lamination of GaN-containing semiconductor layers is taken as an example. A nitride semiconductor including Ga, such as GaN, AlGaN, InGaN, and AlGaInN, is referred to as a GaN-containing semiconductor. Nitride semiconductors also include AlN and InN.

Note that the size of each component in the figures is different from the actual ratio. For example, the area of the opening (5h) relative to the high-resistance transparent conductive film (5) and the area of the n-side electrode (the wiring electrode (16w)) relative to the whole area of the principal surface of the GaN-containing semiconductor layer (2) is smaller than the illustrated ones and may be about 5 to 15%.

As illustrated in FIGS. 2A to 2C, the nitride semiconductor light-emitting element (LED element) (101) has, for example, a lamination of GaN-containing semiconductor layers (light emitting region) (2) including an undoped GaN layer (21), a n-type GaN layer doped with Si etc. (22), an active layer having a multi-quantum well (MQW) structure formed of GaN/InGan multi-layer (24), a p-type AlGaN clad layer (25), and p-type GaN contact layer (26). On one principal surface of the lamination of semiconductor layers (2) (the bottom surface in the figure), a reflecting electrode layer (4) formed of Ag or the like is formed, and an Au layer (6) for eutectic formation is formed over the reflecting electrode layer (4).

On the opposite surface of the lamination of semiconductor layers (2), a high-resistance transparent conductive film (5) having an opening (5h) (FIG. 1B) is formed. On the surface of the lamination of GaN-containing semiconductor layers (2) exposed in the opening (5h) in the high-resistance transparent conductive film (5) and on part of the high-resistance transparent conductive film (5) at the periphery of the opening (5h), an n-side electrode (16) (a wiring electrode (16w) and a pad electrode (16p)) is formed.

On a silicon (Si) support substrate (10), an eutectic layer (7) including eutectic materials formed by laminating, for example, Pt, Ti, Ni, Au, Pt, and AuSn is formed. The eutectic layer (7) and the Au layer (6) are pressed to each other and heated to form a eutectic alloy layer, via which the support substrate (10) is bonded with the reflecting electrode layer (4). Through the pad electrode (16p) power from outside is supplied to the LED element (101).

In the plan view of FIG. 1A, a high-resistance transparent conductive film (5) is indicated with right-side-down hatching, while the wiring electrode (16w) and the pad electrode (16p) are indicated with left-side-down hatching. In the embodiment, the high-resistance transparent conductive film (5) is used as a layer for spreading current upon application of excessive voltage and part of the transparent conductive film (5) is overlapped with the wiring electrode (16w). FIG. 1A indicates the overlap between the high-resistance transparent conductive film (5) and the wiring electrode (16w) by cross-hatching.

In the embodiment, as illustrated in FIG. 1B, an opening (5h) is provided in the high-resistance transparent conductive film (5) to form a contact region for the n-side electrode (16). As illustrated in FIG. 1A, for example, the width of the opening (5h) is set so as to decrease with an increasing distance from the pad electrode (16p) and the width of the wiring electrode (16w) is constant regardless of the distance from the pad electrode (16p). With an increasing distance from the pad electrode (16p), the area of the overlap between the high-resistance transparent conductive film (5) and the wiring electrode (16w) increases and the connection resistance decreases. The area of the overlap between the high-resistance transparent conductive film (5) and the wiring electrode (16w) gradually increases from the closest end to the pad electrode (16p) to the farthest end therefrom. The width of the overlap at the farthest end from the pad electrode (16p) is preferably equal to or greater than the film thickness of the n-side electrode (16).

Figure 3:
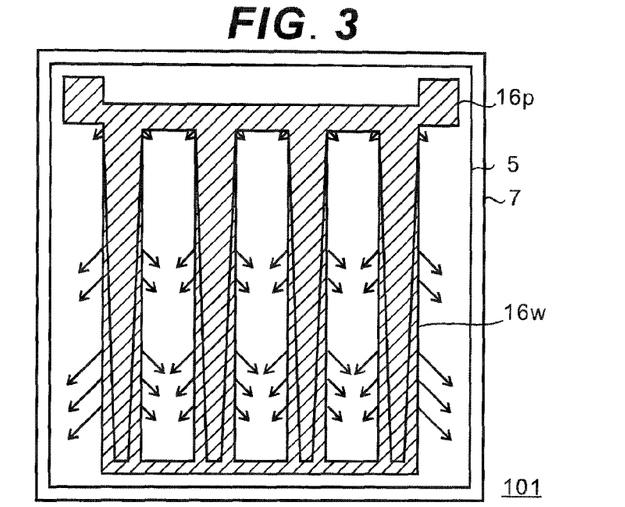
FIG. 3 is a schematic plan view schematically illustrating the current flow when a high voltage is applied to the nitride semiconductor light-emitting element (LED element) (101).

FIG. 3 schematically illustrates the current flow that is generated when an excessive voltage is applied to the pad electrode (16p). The resistance of the high-resistance transparent conductive film (5) is higher than that of the electrode (16) but lower than that of the lamination of semiconductor layers (2). When a high voltage due to static electricity or the like is applied, a current flows into the high-resistance transparent conductive film (5) through the contact region with the wiring electrode (16w), from which the current flows in a direction away from the pad electrode (16p) and spreads towards the outer periphery of the element. The current flow from the wiring electrode (16w) to the lamination of semiconductor layers (2) is suppressed in this manner so that the damage to the semiconductor light-emitting device (101) can be reduced. As a result, the resistance to electrostatic discharge is improved, leading to an improvement in reliability.

Because of the formation of an overlap between the high-resistance transparent conductive film (5) and the wiring electrode (16w), the contact area between the high-resistance transparent conductive film (5) and the wiring electrode (16w) is secured so that the current can flow to the high-resistance transparent conductive film (5) efficiently. In addition, by increasing the area of the overlap between the high-resistance transparent conductive film (5) and the wiring electrode (16w) with an increasing distance from the pad electrode (16p), the spread of the current towards the outer periphery can be promoted and current concentration in the semiconductor region in the vicinity of the pad electrode (16p) can be prevented efficiently.

Here, the width of the wiring electrode (16w), the overlap width between the high-resistance transparent conductive film (5) and the wiring electrode (16w), and the thickness of the wiring electrode (16w) near line AA in FIG. 1A are denoted by Aa, Ab, and At, respectively. The width of the wiring electrode (16w), the overlap width between the high-resistance transparent conductive film (5) and the wiring electrode (16w), and the thickness of the wiring electrode (16w) near line BB are denoted by Ba, Bb, and Bt, respectively, while the width of the wiring electrode (16w), the width of the overlap between the high-resistance transparent conductive film (5) and the wiring electrode (16w), and the thickness of the wiring electrode (16w) near line CC are denoted by Ca, Cb, and Ct, respectively. These values are set so as to satisfy the relations: Aa<or=Ba<or=Ca, 0<or=Ab<or=Bb<or=Cb, and At<or=Bt<or=Ct. Note that, except for the case of Ab=Bb=Cb=0, at least near line CC (farthest end from the pad electrode (16p)), an overlap between the high-resistance transparent conductive film (5) and the wiring electrode (16w) is formed. In the above embodiment, the relations Aa=Ba=Ca, Ab<Bb<Cb, and At=Bt=Ct are satisfied. At the farthest end from the pad electrode (16p) (near line CC), the total width of the right and left overlaps (2Cb) is set so as to be equal to or greater than the thickness of the wiring electrode (16w) (Ct) (2Cb>or=Ct).

In the embodiment, current supply and current spreading to the semiconductor region (2) during ordinary operation are performed by the wiring electrode (16w) and the high-resistance transparent conductive film (5) is intended to be mainly used for auxiliary current spreading when a high voltage of static electricity or the like is applied. Therefore, the film thickness of the high-resistance transparent conductive film (5) can be set to 10 nm or less. If the high-resistance transparent conductive film (5) is thin, the absorption of emitted light can be suppressed, making it possible to suppress the output drop.

The refractive index of ITO used for the high-resistance transparent conductive film (5) is about 2.0. By forming it on a lamination of GaN-containing semiconductor layers (2) with a refractive index of 2.4, an anti-refection effect relative to air, which has a refractive index of 1.0, is achieved, resulting in the increase in the amount of light extraction. Moreover, because ITO with high resistance and low oxygen vacancies absorbs less light and has a high transmittance, element output can be increased at least compared with the case of using low resistance ITO.

The film thickness of the high-resistance transparent conductive film (5) is set 50 nm or less, more preferably 30 nm or less. Light absorption in the film is limited low by limiting the thickness of the film. In the embodiment, an overlap between the transparent electrode and the wiring electrode (16w) is formed, and hence enough contact area between the transparent electrode and the wiring electrode (16w) can be secured even if the film thickness of the high-resistance transparent conductive film (5) is relatively thin, allowing current to flow into the high-resistance transparent conductive film (5) efficiently when an excessive voltage is applied. Note that the film thickness of a transparent conductive film formed for current spreading during the ordinary driving is generally 100 nm or more, because if the film is thinner than this, the current spreading effect during ordinary driving is difficult to obtain.

As described above, because the transparent electrode (5) in the embodiment has an auxiliary role for current spreading, the contact resistance of the transparent electrode with the lamination of semiconductor layers is made higher than that of a general transparent conductive film, but ohmic contact is formed with the lamination of semiconductor layers.

In the embodiment, current spreading during ordinary driving is performed by the wiring electrode (16w). The contact resistance of the transparent electrode (5) with the n-type semiconductor layer (the underlying GaN layer (21) or the n-type GaN layer (22)) is set to a value much higher than the contact resistance of the wiring electrode (16w). Therefore, when a high voltage of static electricity or the like is applied, the transparent electrode (5) does not concentrate the current on part of the lamination of semiconductor layers but spreads the current in itself in directions away from the pad electrode (16p) and towards the outer periphery of the semiconductor light-emitting device. Spreading of current prevents destruction of the element.

The contact resistance between the high-resistance transparent conductive film (5) and the n-type semiconductor layer (the underlying GaN layer (21) or the n-type GaN layer (22)) is preferably $1.0 \times 10^{-1}$ $\Omega$cm$^2$ or more. The upper limit of the contact resistance may be about $1.0 \times 10^{+2}$ $\Omega$cm$^2$. If this limit is exceeded, the resistance becomes so high that the current will not flow easily even if an excessive voltage is applied. Generally, the contact resistance of a transparent conductive film used for current spreading is $1.0 \times 10^{-2}$ $\Omega$cm$^2$ or less. In the embodiment, the contact resistance value is set in the above-mentioned high resistance range because the current spreading in ordinary operation is performed mainly by the wiring electrode (16w), and the transparent electrode (5) works only during excessive voltage application. The contact resistance between the wiring electrode (16w) and the n-type semiconductor layer (the underlying GaN layer (21) or the n-type GaN layer (22)) is generally in a range of $1.0 \times 10^{-5}$ $\Omega$cm$^2$ to $1.0 \times 10^{-2}$ $\Omega$cm$^2$, and preferably about 1.0 to $5.0 \times 10^{-5}$ $\Omega$cm$^2$. The contact resistance between the transparent electrode (5) and the n-type semiconductor layer (21 or 22) is at least one order of magnitude higher than the upper limit of the contact resistance between the wiring electrode (16w) and the n-type semiconductor layer.

As described above, in the farthest end from the pad electrode (16p), the overlap width between the high-resistance transparent conductive film (5) and the wiring electrode (16w) (the overlap width Cb on one side×2 in FIG. 2C) is set to a value greater than the film thickness of the wiring electrode (16w) (the film thickness Ct in FIG. 2C). For example, the overlap width is set to a value greater than the total film thickness of 3 μm of the wiring electrode (16w). The aim of setting the overlap width (2Cb) to a value greater than the film thickness (Ct) of the wiring electrode (16w) is to lower the resistance so that current can flow easily from the wiring electrode (16w) to the transparent electrode (5) when an excessive voltage is applied.

The relation $\Omega_1/(\Omega_1+\Omega_2)>$or=$1.0 \times 10^{-8}$ is maintained, Letting $\Omega_1$ denote the contact resistance of the n-side electrode (16) ($\Omega$cm$^2$) divided by the area of the n-side electrode (16) (cm$^2$), (i.e. the resistance of the path passing through the semiconductor layer from the n-side electrode (16)), and $\Omega_2$ denote the contact resistance of the high-resistance transparent conductive film (5) ($\Omega$cm$^2$) divided by the overlap area between the n-side electrode (16) and the high-resistance transparent conductive film (5) (cm$^2$), (i.e. the resistance of the path from the n-side electrode (16) to the lamination of semiconductor layers (2) through the transparent electrode (5)). The minimum value, $1.0 \times 10^{-8}$, is obtained as the minimum value within the range of the embodiment assuming that the contact resistance of the n-side electrode (16) is $1.0 \times 10^{-5}$ $\Omega$cm$^2$, the contact resistance of the high-resistance transparent conductive film (5) is $1.0 \times 10^{+2}$, the area of the n-side electrode (16) is $9.96 \times 10^{-4}$ cm$^2$ (when the area of the pad electrode (16p) is assumed to be 110 μm and the area of the wiring electrode (16w) is assumed to be 20 μm) and the area of the overlap between the high-resistance transparent conductive film (5) and the wiring electrode (16w) is $9.0 \times 10^{-5}$ cm$^2$ (when the overlap of the region farthest from the pad is assumed to be 3 µm).

The manufacturing method of a nitride semiconductor light-emitting element (LED element) (101) according to the embodiment of the invention is described below with reference to FIGS. 4 to 13.

Figure 4:
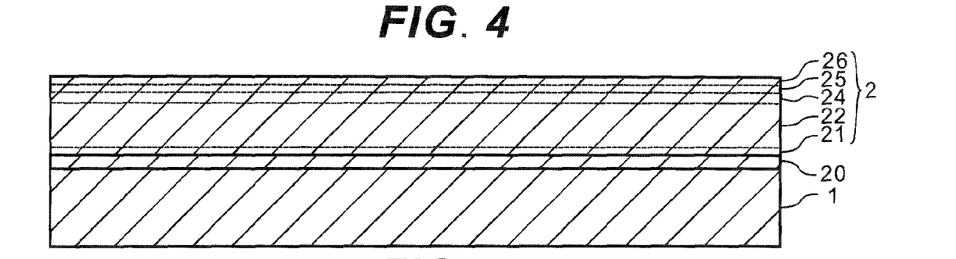
FIGS. 4 to 13 are schematic sectional views for illustrating steps of the method of manufacturing the nitride semiconductor light-emitting element (101).

First, a semiconductor film formation step illustrated in FIG. 4 is performed. In this step, a growth substrate (e.g., a C-plane sapphire substrate) (1) on which $Al_xIn_yGa_zN$ (0<or=x<or=1, 0<or=y<or=1, 0<or=z<or=1, x+y+z=1) can be grown by MOCVD is prepared and an $Al_xIn_yGa_zN$ lamination of semiconductor layers (a lamination of GaN-containing semiconductor layers) (2) is crystal-grown on the growth substrate (1) by MOCVD.

Concretely, a sapphire substrate (1) is put in an MOCVD device and heated at 1,000 degrees C. for 10 minutes in an hydrogen atmosphere (thermal cleaning). Next, a low temperature buffer layer (a GaN layer) (20) is formed by supplying 10.4 µmol/min of TMG and 3.3 LM of NH$_3$ at about 500 degrees C. for three minutes.

Next, a low temperature buffer layer (20) is crystallized by rising the temperature to 1,000 degrees C. and keeping the temperature for 30 seconds, and then a underlying GaN layer (an undoped GaN layer) (21) with a film thickness of about 1 µm is grown by supplying 45 µmol/min of TMG and 4.4 LM of NH$_3$ for 20 minutes in this temperature.

Then, a Si-doped n-type GaN layer (22) with a film thickness of about 7 µm is grown by supplying 45 µmol/min of TMG, 4.4 LM of NH$_3$ and $2.7 \times 10^{-9}$ µmol/min of SiH$_4$ at 1,000 degrees C. for 120 minutes.

Next, a multiquantum well structure including, for example, GaN/InGaN multi-layer, is grown to form an active layer (24). With InGaN/GaN as one cycle, for example, growth of five cycles is performed. An InGaN well layer with a film thickness of 2.2 nm is grown by supplying 3.6 µmol/min of TMG, 10 µmol/min of TMI, and 4.4 LM of NH$_3$ for 33 seconds and a GaN barrier layer with a film thickness of about 15nm is grown by supplying 3.6 µmol/min of TMG and 4.4 LM of NH$_3$ for 320 seconds at a temperature of 700 degrees C. for five cycles.

The temperature is risen to 870 degrees C. and a Mg-doped p-type AlGaN clad layer (25) is grown to a thickness of about 40 nm by supplying 8.1 µmol/min of TMG, 7.5 µmol/min of TMA, 4.4 LM of NH$_3$, and $2.9 \times 10^{-7}$ µmol/min of Cp$_2$Mg for five minutes. Subsequently, a Mg-doped p-type GaN contact layer (26) is grown to a thickness of about 150 nm by supplying 18 µmol/min of TMG, 4.4 LM of NH$_3$, and $2.9 \times 10^{-7}$ µmol/min of Cp$_2$Mg for seven minutes with this temperature maintained.

Figure 5:
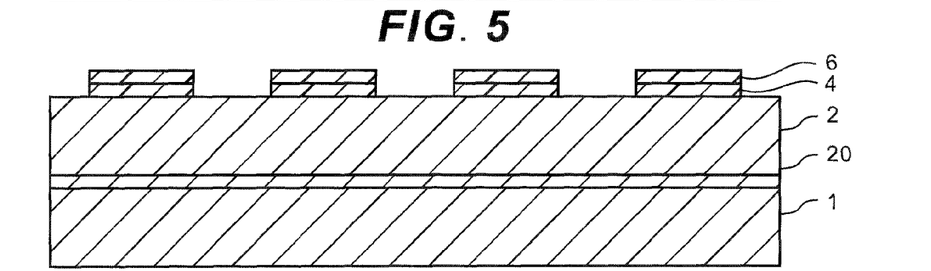

A p-electrode formation step illustrated in FIG. 5 is performed. By using the photolithography and electron-beam (EB) evaporation techniques, a p-electrode including a reflecting electrode layer (4) formed of a stack of Pt (1 nm), Ag (150 nm), Ti (100 nm), and Pt (100 nm), and a eutectic (Au) layer (6) of Au (200 nm) is formed at a desired position on a p-type GaN (26) surface where a p-electrode formation region is exposed. Though a p-electrode formation step is performed before an element isolation step, it is also possible to perform a p-electrode formation step after an element isolation step as illustrated in FIG. 6.

Figure 6:
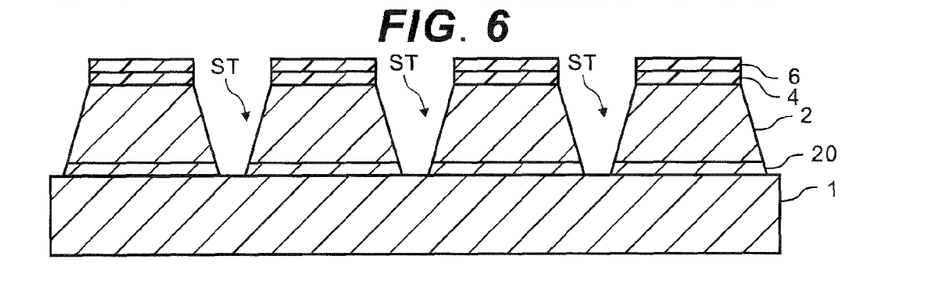

An element isolation etching step illustrated in FIG. 6 is performed. A lamination of GaN-containing semiconductor layers (2) is patterned by the photolithography and etching techniques to form a street region ST between each element (101). Concretely, the surface of a lamination of GaN-containing semiconductor layers (2) is coated with a photoresist, irradiated with light, and developed, and then the unnecessary region (the exposed region) of the lamination of GaN-containing semiconductor layers (2) is removed by dry etching to form a street region ST (2) between adjacent lamination of GaN-containing semiconductor layers (2). Then, the photoresist is removed with a remover.

Figure 7:
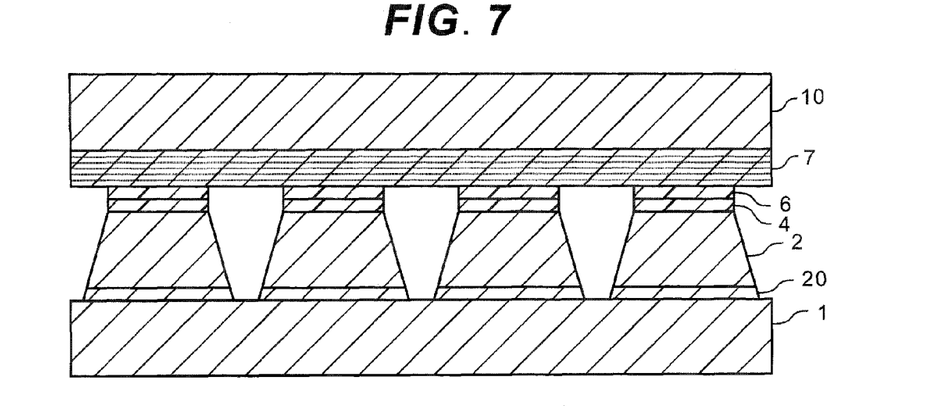

A support formation and bonding (thermocompression bonding) step illustrated in FIG. 7 is performed. A support (Si) substrate (10) on which a eutectic layer (7) including eutectic materials of Pt, Ti, Ni, Au, Pt, and AuSn is formed is prepared. The eutectic layer (7) of the support substrate (10) and an eutectic layer (6) of an epitaxial substrate are brought into contact with each other by using a pasting device, and then the Si substrate (10) and the lamination of GaN-containing semiconductor layers are bonded through AuSn eutectic bonding that is produced by applying a pressure of 350 kg for 10 minutes at 340 degrees C. (thermocompression bonding).

Figure 8:
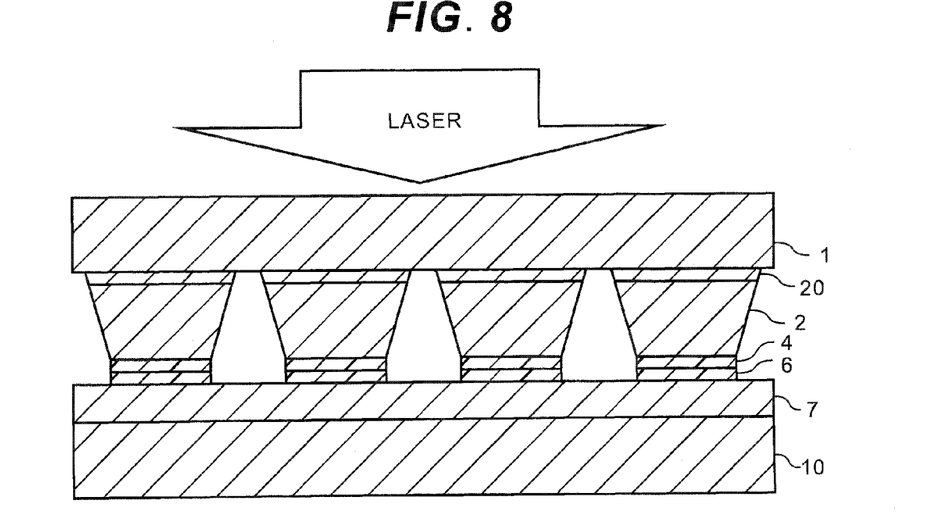
Figure 9:
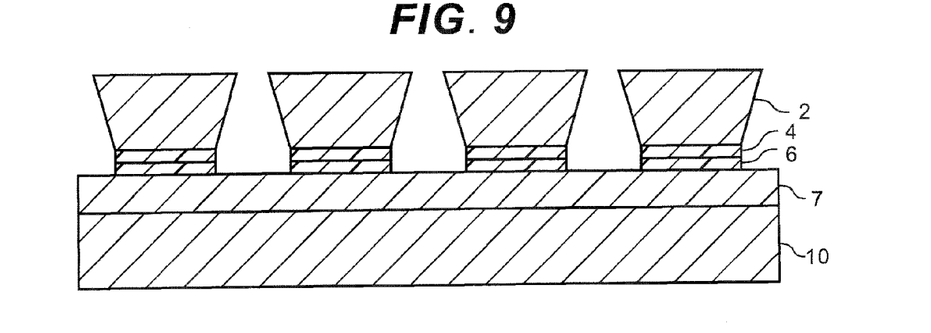

Then, a sapphire growth substrate separation step illustrated in FIGS. 8 and 9 is performed. In this step, a sapphire substrate is separated by a laser liftoff method (LLO). For the laser, a KrF excimer laser with a wavelength of 248 nm is used. The energy of the laser is about 800 mJ/cm$^2$. Because GaN on the surface of the sapphire substrate (1) is decomposed into metal Ga and nitride, the plane exposed after the substrate separation is mainly an underlying GaN layer (21) or an n-type GaN layer (22).

Excimer laser is applied through the back surface of the sapphire substrate (1) (the sapphire substrate side) to decompose a buffer layer (20) as illustrated in FIG. 8 so that the sapphire substrate (1) and the lamination of GaN-containing semiconductor layers (2) are separated as illustrated in FIG. 9. Ga generated by laser lift-off is removed with hot water etc., and then the surface is treated with hydrochloric acid. For surface treatment, acid or alkali chemicals that can etch a nitride semiconductor, including phosphate, sulfate, KOH, and NaOH, may be used. Surface treatment may also be performed by dry etching using Ar plasma or chlorine plasma or polishing.

For the steps described above, other known steps may also be used. For example, U.S. Ser. No. 13/588,305, U.S. Ser. No. 13/598,951, U.S. Ser. No. 13/269,830 (Japanese patent application No. 2011-269830), which are incorporated herein by reference, can be referenced.

Figure 10:
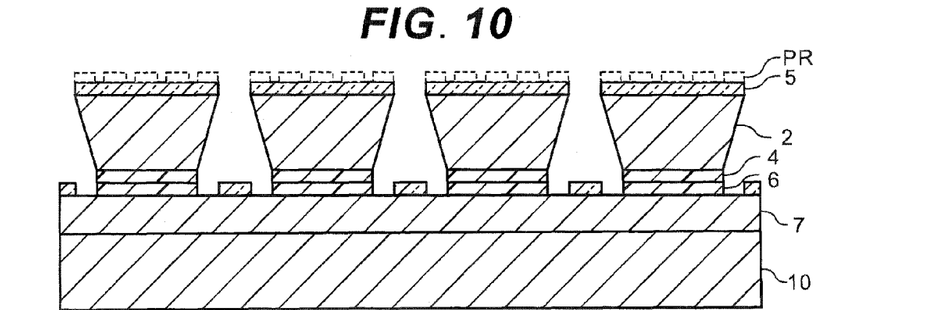
Figure 11:
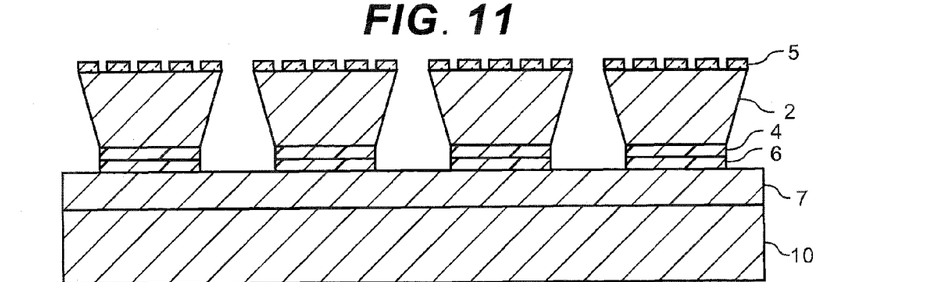

Next, transparent electrode formation step illustrated in FIGS. 10 and 11 is performed. As illustrated in FIG. 10, a transparent electrode (5) is formed over the n-type semiconductor layer (the underlying GaN layer (21) or the n-type GaN layer (22)) that is exposed in the sapphire growth substrate separation step by using sputtering or an electron-beam evaporation technique. An example is formation of a 20 nm-thick ITO layer by magnetron sputtering. For example, the underlying surface is heated to 200 degrees C., the pressure may be 0.5 Pa, the argon flow rate may be 50 sccm, and the oxygen flow rate may be 5 sccm.

Next, by performing etching using a photoresist mask PR, an opening (5h) is patterned on part of the region where a wiring electrode (16) is formed and on the region where a pad electrode (16p) is formed. For example, for a pattern of the wiring electrode (16w) of the n-side electrode (16) where film is formed later, an ITO layer (5) may be structured so that it has no overlap at the closest end to the pad electrode (16p) (near line AA in FIG. 1A) and fully overlaps with the electrode across its entire width of 20 µm as illustrated by broken line in FIG. 1B, at the farthest end from the pad electrode (16p) (near line CC in FIG. 1A). The wiring electrode located on the opposite side of the pad electrode (16p) may be structured so that it fully overlaps with the transparent electrode (5). Thereafter, the transparent electrode is subjected to annealing for one minute at 700 degrees C. in an atmosphere with an $O_2$ flow rate of 2 liters/min to increase the transparency as illustrated in FIG. 11.

For the transparent electrode (5), generally known materials such as ITO (indium tin oxide) and ZnO (zinc oxide) may be used. For patterning film on an element, available methods include etching and lift-off using a photoresist mask. Though a film formation temperature of 200 degrees C. is used as an example, film formation may be performed at room temperature by increasing the oxygen flow and increasing the annealing temperature.

A transparent electrode (5) is subjected to annealing for increasing the transparency after the patterning of the element region. The annealing temperature is preferably 600 degrees C. or higher but not higher than 900 degrees C. Annealing below 600 degrees C. increases the $O_2$ carrier mobility of ITO, causing not only a decrease in resistance but also a decrease in transmittance. Annealing above 900 degrees C. causes crystal defects due to heat, causing a decrease in transmittance. A transparent electrode can also be formed by adjusting the oxygen flow rate during annealing.

The film thickness of the transparent electrode (5) is 50 nm or less, and more preferably 30 nm or less. The film thickness of a transparent conductive film formed for current spreading during ordinary driving is generally 100 nm or more. If the film is thinner than this, the current spreading effect during ordinary driving is difficult to obtain.

Figure 12:
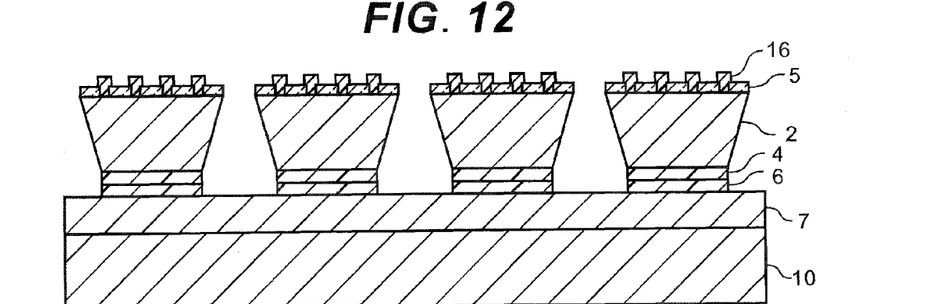

An n-side electrode formation step illustrated in FIG. 12 is performed. A photoresist mask having an opening at an electrode formation region on the surface of the n-type semiconductor layer (the underlying GaN layer (21) or the n-type GaN layer (22)) and on part of the surface of the transparent electrode (5) (the overlap between the transparent electrode (5) and the wiring electrode (16w)) is formed to form a film of an electrode metal (e.g., Ti/Al) by EB evaporation etc.

As an example, it is formed by stacking Ti (1 nm), Al (200 nm), Ti (100 nm), Pt (200 nm), and Au (2500 nm). Thereafter, an n-side electrode (16) (a wiring electrode (16w) and a pad electrode (16p)) is patterned to a desired shape by lift-off.

Figure 13:
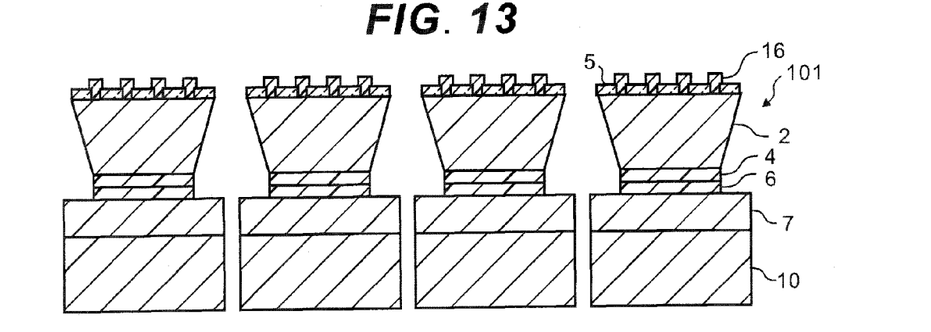

Next, elements are separated by scribing and breaking as illustrated in FIG. 13. With these steps, production of a nitride semiconductor light-emitting elements (101) is completed. A white light source can be made by covering and sealing the GaN blue light-emitting diode with resin containing yellow phosphor.

According to the embodiment described above, by forming a transparent electrode on the surface of a lamination of semiconductor layers and forming a wiring electrode thereon in a manner that it partially overlaps the transparent electrode, the current can be allowed to spread through the overlap between the wiring electrode and the transparent electrode when an excessive voltage, higher than the semiconductor light-emitting device driving voltage, is applied to the semiconductor light-emitting device due to static electricity or the like, making it possible to reduce the damage to the semiconductor light-emitting device. This can result in an improvement in the resistance to electrostatic discharge and an improvement in the reliability of the semiconductor light-emitting device.

Figure 14:
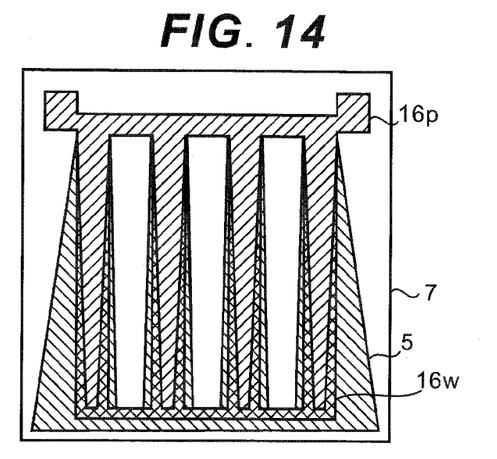
FIG. 14 is a schematic plan view of the nitride semiconductor light-emitting element according to a first modification of the embodiment.

In the embodiment described above, the pattern of the transparent electrode (5) is designed to cover the entire element region (the surface of the lamination of semiconductor layers (2)) except the n-side electrode (16) (the wiring electrode (16w) and the pad electrode (16p)) (see FIG. 1B). It is also possible to use a pattern of the transparent electrode (5) covering an active region only near the wiring electrode (16w) as illustrated in FIG. 14. In this case, the area of the element covered with the transparent electrode (5) increases with an increasing distance from the pad electrode (16p) as illustrated in FIG. 14. Because a transparent electrode (5) is not formed on the region other than the vicinity of the wiring electrode (16w). Load on the conductive film formed area, upon application of a large voltage, becomes greater as compared to the pattern illustrated in FIG. 1B. The size of the overlap between the wiring electrode (16w) and the transparent electrode (5) at the farthest end from the pad electrode (16p) is twice or greater than the thickness of the wiring electrode (16w).

Figure 15:
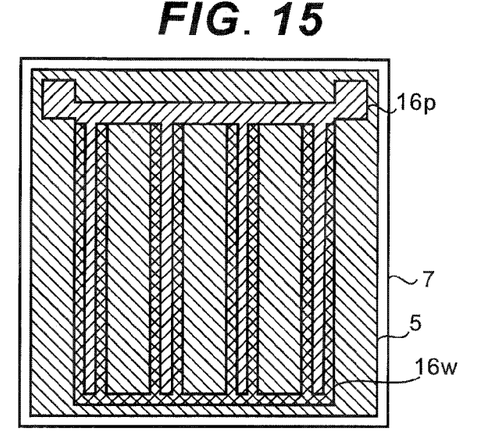
FIG. 15 is a schematic plan view of the nitride semiconductor light-emitting element according to a second modification of the embodiment.

As illustrated in FIG. 15, a pattern in which the overlap between the transparent electrode (5) and the wiring electrode (16w) is constant regardless of the distance from the pad electrode (16p) may also be used. In this case, the area of the overlap between the wiring electrode (16w) and the transparent electrode (5) is equal to or greater than the thickness of the wiring electrode (16w).

Figure 16:
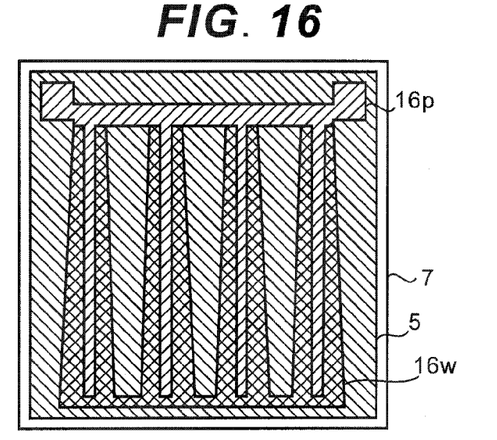
FIG. 16 is a schematic plan view of the nitride semiconductor light-emitting element according to a modification of the embodiment.

As illustrated in FIG. 16, it is also possible to use a pattern in which the opening width of the transparent electrode (5) is kept constant regardless of the distance from the pad electrode (16p) and the width of the wiring electrode (16w) covering the opening, increases with the distance from the pad electrode (16p).

A sapphire substrate is used as the growth substrate 1 in the embodiment described above, but a GaN substrate or a SiC substrate may also be used as the growth substrate. For materials of the lamination of semiconductor layers (2), AlGaInP, ZnO, etc. may be used besides GaN.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. A semiconductor light-emitting device comprising:
    a lamination of semiconductor layers including a first semiconductor layer of a first conductivity type, an active layer formed on the first semiconductor layer, and a second semiconductor layer of a second conductivity type formed on the active layer;
    a transparent conductive film formed on a first principal surface of the lamination of semiconductor layers and having an opening, wherein the opening includes a pad area and a plurality of wiring electrode areas extending from the pad area, and the opening is provided in the transparent conductive film such that the transparent conductive film surrounds the opening;
    a pad electrode formed on a first part of the first principal surface, the first part of the first principal surface being exposed in the pad area of the opening of the transparent conductive film, wherein the pad electrode has a shape which substantially corresponds to a shape of the pad area of the opening; and
    a plurality of wiring electrode portions formed on a plurality of other parts of the first principal surface excluding the first part, wherein the plurality of other parts are exposed in the plurality of wiring electrode areas of the opening of the transparent conductive film, each of the plurality of wiring electrode portions is connected with the pad electrode and overlaps with a part of the transparent conductive film, and the plurality of wiring electrode portions have a shape which substantially corresponds to a shape of the plurality of wiring electrode areas of the opening;

wherein a contact resistance between the transparent conductive film and the lamination of semiconductor layers is larger than a contact resistance between the plurality of wiring electrode portions and the lamination of semiconductor layers.

2. The semiconductor light-emitting device according to claim 1, wherein the contact resistance between the transparent conductive film and the lamination of semiconductor layers is in a range between $1.0 \times 10^{-1}$ $\Omega cm^2$ and $1.0 \times 10^2$ $\Omega cm^2$.

3. The semiconductor light-emitting device according to claim 1, wherein the transparent conductive film is formed of ITO and has a film thickness of 50 nm or less.

4. The semiconductor light-emitting device according to claim 1, wherein a width of overlapping between the plurality of wiring electrode portions and the transparent conductive film increases with distance from the pad electrode.

5. The semiconductor light-emitting device according to claim 1, wherein a width of overlapping between the plurality of wiring electrode portions and the transparent conductive film is greater than a thickness of the plurality of wiring electrode portions at a farthest end from the pad electrode.

6. The semiconductor light-emitting device according to claim 1, wherein a ratio of an area of the plurality of wiring electrode portions to a total area of the first principal surface of the lamination of semiconductor layers is in a range between 5% and 15%.

7. The semiconductor light-emitting device according to claim 1, further comprising a reflecting electrode formed on a second principal surface of the lamination of semiconductor layers.

8. The semiconductor light-emitting device according to claim 7, wherein the reflecting electrode contains Ag.

9. The semiconductor light-emitting device according to claim 7, further comprising a support substrate connected with the reflecting electrode.

10. The semiconductor light-emitting device according to claim 1, wherein the pad electrode and the plurality of wiring electrode portions constitute a comb-shaped electrode, wherein the plurality of wiring electrode portions form teeth of the comb-shaped electrode.

11. A semiconductor light-emitting device comprising:

a lamination of semiconductor layers including a first semiconductor layer of a first conductivity type, an active layer formed on the first semiconductor layer, and a second semiconductor layer of a second conductivity type formed on the active layer, and having a first principal surface;

a transparent conductive film formed on the first principal surface of the lamination of semiconductor layers and having an opening, wherein the opening includes a pad electrode area and a plurality of wiring electrode areas extending from the pad electrode area, and the opening is provided in the transparent conductive film such that the transparent conductive film surrounds the opening; and an electrode layer formed on the first principal surface and including a pad electrode portion formed in the pad electrode area of the opening, and a plurality of wiring electrode portions formed in the plurality of wiring electrode areas of the opening, wherein each of the plurality of wiring electrode portions is connected with the pad electrode portion, the electrode layer overlaps with a part of the transparent conductive film, and the electrode layer has a shape which substantially corresponds to a shape of the opening in the transparent conductive film.

12. The semiconductor light-emitting device according to claim 11, wherein a contact resistance between the transparent conductive film and the lamination of semiconductor layers is larger than a contact resistance between the electrode layer and the lamination of semiconductor layers.

* * * * *